United States Patent [19]

Petrich et al.

[11] Patent Number: 4,527,126
[45] Date of Patent: Jul. 2, 1985

[54] AC PARAMETRIC CIRCUIT HAVING ADJUSTABLE DELAY LOCK LOOP

[75] Inventors: Dennis M. Petrich, Mound; Jan B. Wilstrup, Shoreview, both of Minn.

[73] Assignee: Micro Component Technology, Inc., Shoreview, Minn.

[21] Appl. No.: 526,551

[22] Filed: Aug. 26, 1983

[51] Int. Cl.³ ............................................. H03K 5/153
[52] U.S. Cl. .................................... 328/155; 307/511; 307/516; 307/263; 307/603; 324/73 R; 328/55; 328/74; 328/133; 328/185
[58] Field of Search ............... 307/228, 494, 511, 514, 307/516, 517, 354, 359, 364, 263, 265, 591, 595, 597, 601, 603; 324/73 R, 73 AT; 328/35, 55, 74, 104, 129.1, 133, 155, 185

[56] References Cited

U.S. PATENT DOCUMENTS

| | | | |
|---|---|---|---|
| 3,790,767 | 2/1974 | Alexander | 324/73 AT X |
| 4,092,589 | 5/1978 | Chau et al. | 324/73 R |
| 4,229,701 | 10/1980 | Bourner | 328/133 X |
| 4,309,673 | 1/1982 | Norberg et al. | 332/16 R |
| 4,338,569 | 7/1982 | Petrich | 328/155 |
| 4,392,105 | 7/1983 | McLeod | 324/73 R X |
| 4,403,193 | 9/1983 | Takemura | 307/514 X |
| 4,449,059 | 5/1984 | Dickes | 307/228 |
| 4,481,647 | 11/1984 | Gombert et al. | 328/55 X |
| 4,488,297 | 12/1984 | Vaid | 328/55 X |

FOREIGN PATENT DOCUMENTS 97454  6/1982  Japan ............................... 324/73 AT

OTHER PUBLICATIONS

Burdett et al, "All Net Probe Card Testing", IBM Tech. Disc. Bull., vol. 20, No. 6, Nov. 1977, pp. 2358-2359.
Geffken, "Variable Parameter Tester Control System", IBM Tech. Disc. Bull., vol. 20, No. 7, Dec. 1977, pp. 2596-2598.

Primary Examiner—Stanley D. Miller
Assistant Examiner—D. R. Hudspeth
Attorney, Agent, or Firm—Lawrence M. Nawrocki

[57] ABSTRACT

An improved delay lock loop which has first and second means (32, 34) for generating a voltage ramp, the first ramp generator (32) providing a train of ramped inputs to first time delay means (38) responsive to a first input pulse train and the second ramp generator (34) providing a train of ramped inputs to a second time delay means (40) responsive to a second input pulse train. The ramp generators (32, 34) provide a highly linear voltage ramp. First and second retrace means (36A, 36B) are connected to the first and second ramp generators (32, 34) respectively and act to limit the ramps to a certain voltage, commanding the ramp generators (32, 34) to return to a reference voltage to await the succeeding input pulse edge transition. A further improvement comprises range switch means (44) that function to selectively control the maximum range of time delay which the delay lock loop is able to sense. This permits selecting a greater or lesser range of time which the delay in time intervals between the edge transitions of the pulses in the first and second input pulse in the first and second input pulse trains can have and still be measured. Additionally, calibrator means (26) are incorporated which provide signals to the delay lock loop and ancillary electronics to determine the delay inherent in these devices. This delay is stored and subtracted from the delay determined by the delay lock loop to increase the accuracy. The calibrator (26) additionally very accurately determines the voltage difference between the voltage representing zero volts on the ramp and the voltage representing full scale on the ramp to very accurately determine the voltage span representative of the selected range.

16 Claims, 3 Drawing Figures

AC PARAMETRIC CIRCUIT HAVING ADJUSTABLE DELAY LOCK LOOP

TECHNICAL FIELD

This invention relates to systems for measuring, comparing or synchronizing the time differences between a pair of pulses in a pair of pulse trains.

More particularly, this invention details an improved delay lock loop useful in testing the time delay caused in signals by the propagation of a signal through an integrated circuit. The improvements provide for generation of a very linear ramp, essential to accurate delay determination, and for means for selectively controlling the length of time over which the delay is measured. The improved delay lock loop can be used in combination with apparatus to facilitate accurately measuring the delay.

BACKGROUND OF THE INVENTION

The invention is useful in measuring the time delay imparted to a signal as it propagates through an integrated circuit (IC). This testing is measured primarily in digital switching integrated circuitry. When a new IC logic family is developed, very extensive data must be taken to document the DC and AC parametric characteristics prior to the IC's being useful in constructing digital devices. Data must be taken, for example, on the effect of variations of power, temperature, and humidity as well as storage, vibration, and radiation. In the past DC parametric testing has been reasonably performed. AC parametric testing has presented a greater challenge. It has either been done in a laboratory setting with very expensive testers or it has been done laboriously on the bench with oscilloscopes, fixtures, pulse generators, power supplies and the like. In all cases, the testing was slower, more expensive and generally not as accurate as the instant device. This invention permits rapid testing of many thousands of IC's, recording of the results, and subsequent introduction. Of a variable such as previously mentioned. Additionally, all the testing can be easily reperformed. Further, the invention makes possible, for the first time, on-line automated AC parametric production testing of many IC's.

The invention is an improvement to a delay lock loop as detailed in U.S. Pat. Nos. 4,309,673 and 4,338,569. The disclosure in those patents is identical. Accordingly, the following remarks are applicable to both patents. No ramp generators were incorporated in the '673 and '569 device. Simply, the rise time of a square pulse was utilized as the ramp. As is known, such pulses appear square when presented as a pulse train on an oscilloscope. In fact, however, there is a finite amount of time required for the pulse to rise. This can be seen very graphically on an oscilloscope by selecting a short time base.

In the embodiment shown in the two cited patents, the pulse was not variable with respect to time. Accordingly, the rise time of the pulse was fixed. Consequently, the range of time was fixed. No range switching was possible. The result was that only delays that were less than the fixed rise time could be measured. This imposed a severe limitation on the utility of the device, at least with respect to the testing of IC's. Further, the rise time was extremely fast being measured in picoseconds whereas the instant device has delay ranges extending out to 1000 nanoseconds.

The rise of the pulse in the '673 and '569 device does not exhibit the high linearity that is required in performing the precise measurements demanded in the application of the instant invention. The slope of the rise is shallow initially, building to a steeper gradient as the rise progresses.

SUMMARY OF THE INVENTION

The present invention is an improved delay lock loop useful in testing the characteristics of an integrated circuit wherein the improvements comprise ramp generation devices to generate voltage ramps that are very linear. The amount of time that the voltage is permitted to continue to ramp is related to the maximum amount of time delay that the delay lock loop can measure. This equates to the maximum delay between a pulse edge transition of a first input pulse train and a pulse edge transition of a second input pulse train. Such a ramp generator is utilized with each input path. Also related to the accuracy of the measurement of the delay lock loop is the time range. It is desireable to be able to vary this depending on the IC being tested. To accomplish this, range switch circuitry is connected to the timing circuitry in the ramp generator. By switching in different components in the timing circuitry, the slope of the ramp may be changed, providing delay measurement capabilities of 10, 20, 50, 100 and 1000 nanoseconds. Such a switch may be controlled by a programmable digital device.

DETAILED DESCRIPTION OF THE INVENTION

Figure 1:
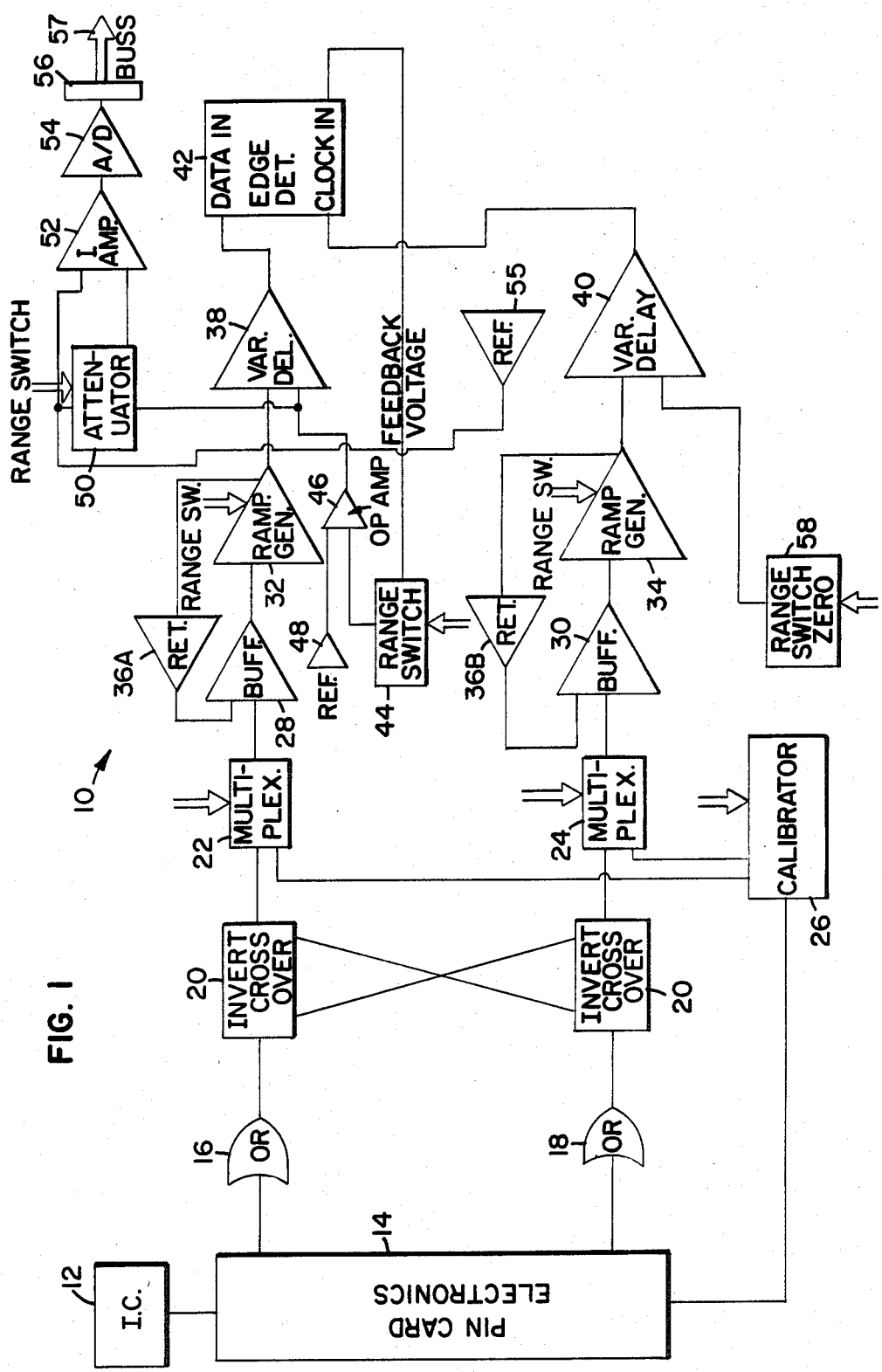
FIG. 1 is a circuit diagram of an embodiment of the present invention comprising an improved delay lock loop useful for measuring time delays in an electric signal caused by the signal being processed by an integrated circuit.

FIG. 1 shows an embodiment of the instant invention comprising test device 10. It is a function of test device 10 to measure the various time delays induced in a signal as it is processed by integrated circuit 12, the device under test. Integrated circuit 12 may be any such device for which it is desired to determine the D.C. and A.C. parametric characteristics. Such devices typically have a plurality of inputs and outputs. To be compatible with a preferred embodiment, integrated circuit 12 may have as many as sixty-four inputs and sixty-four outputs. The integrated circuit 12 is tested at very high speed, with each A.C. parameter being determined in a matter of microseconds. Where desired, a mechanical feed device may sequentially present a large number of integrated circuits to be rapidly tested.

In a preferred embodiment, testing device 10 is controlled by a programmable device (not shown), such device being preferably digital in nature. In the figure, interface with such programmable device is shown by the broad shafted arrows.

Figure 2:
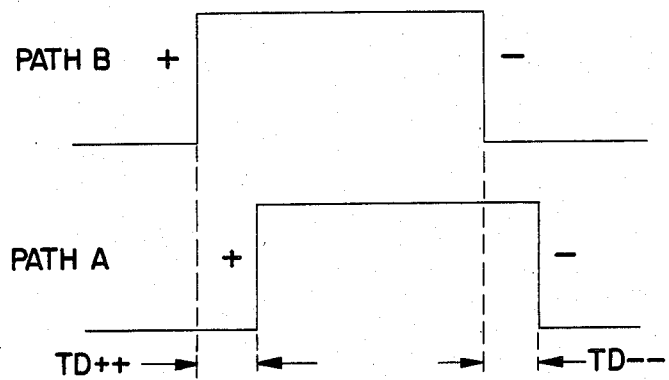
FIG. 2 is a pair of time domain waveform diagram showing the time delays desired to be measured.
Figure 2:
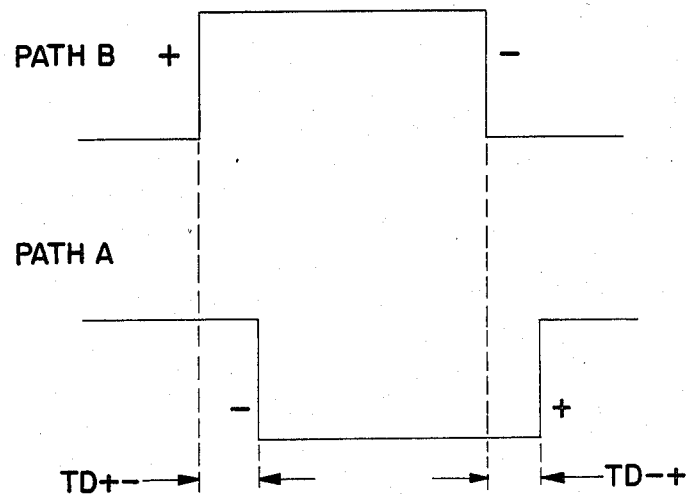

Typical delays to be measured in determining the A.C. characteristics of integrated circuit 12 are shown in FIG. 2. Two identical pulses are shown, the path A pulse being delayed in time with respect to the path B pulse. The positive going voltage is conventionally called plus (+) and the negative going voltage is minus (−). Four typical measurements are shown; the time delay between the positive going pulses, TD++, and the time delay between the negative going pulses TD−−. Other typical delay measurements shown include the delay between the positive going pulse of Path B and the negative going pulse of Path A, TD+− and the delay between the negative going pulse of Path B and the positive going pulse of Path A, TD−+.

To obtain such measurements, integrated circuit 12 is connected to pin card electronics 14, as shown in FIG. 1. Pin card electronics 14 provide an interface to each pin on integrated circuit 12, each such pin being an input or output of such circuit. The pin card electronic interface to each pin comprises two paths, corresponding to path A and path B, as shown in FIG. 2. Each such path comprises a potential source of a pulse train for presentation to the remainder of test device 10 and to be acted thereupon. In a preferred embodiment a simple software statement to a digital programmable device selects the pins and parameters to be measured. Such command may state "measure TD+− PIN 5 to PIN 7". Such a command would select as inputs to test device 10, path B on pin 5 and path A on pin 7.

Pin electronics card 14, has two outputs. Each output may initiate a transition based on one of two voltages sensed at the IC. The programmable device determines which of the two voltages is to be used for sensing each output of Pin electronics card 14.

Connected to pin card electronics 14 are two OR gates, path A OR gate 16 and path B OR gate 18. Each such OR gate has a plurality of input connections connected to pin card electronics 14 divided between path A OR gate 16 and path B OR gate 18 there will be an input connection for each pin on integrated circuit 12. In a preferred embodiment, path A OR gate 16 and path B OR gate 18 each have sixty-four inputs. In operation each such OR gate will pass the desired inputs to the remainder of test device 10 as commanded by the programmable device. For example, in response to the previously stated command, path A OR gate 16 outputs the pulse train that is inputted to it on the connection to pin card electronics 14 which is interfaced to pin 7. Similarly, path B OR gate 18 will output the pulse train that is inputted to it from pin 5.

The outputs from both path A OR gate 16 and Path B OR gate 18 are sent to inverter/crossover network 20. Inverter/crossover network 20 selectively performs two functions. First, it inverts the respective pulses of the pulse train where required. It is a characteristic of test device 10 that it will act only on positive going pulses. Accordingly, where the selected time delay being measured is TD++, no inverting is required since the pulse edge transition for both path A and path B is a positive going pulse. However, where the measurement being made is TD−−, both pulse edge transitions are negative going. In this case, inverter/crossover network 20 will invert both the path A and path B negative going pulse edge transitions to positive going pulse edge transitions which test device 10 is capable of acting upon.

The second function of inverter/crossover network 20 is to selectively route incoming path A pulse trains through path B and simultaneously route incoming path B pulse trains through path A. Test device 10 always measures the delay in path A pulse edge transitions with respect to path B pulse edge transitions. Occasionally, it is desirable to measure such delay where the path B edge transition occurs after the path A edge transition. This occurs, for example, where test device 10 is measuring the rise and fall times of a pulse. In this situation, path B represents the reference or low voltage and path A represents the elevated voltage. When measuring rise time, the path B voltage occurs first, but when measuring fall time, the pulse commences from the path A or elevated voltage and falls to the path B or reference voltage. When test device 10 is measuring fall time, the path A edge transition must be sent through path B, and the path B edge transition must be sent through path A in order to preserve the relationship that the path B event must occur prior to the path A event.

Inverter/crossover network 20 outputs a pulse train to the path A multiplexer 22 and a further pulse train to the path B multiplexer 24 wherein the events to be measured are positive going edge transitions and the path A edge transition occurs concurrent with or delayed with respect to the path B edge transition. The A and B multiplexers are connected to, and receive inputs from, calibrator 26 as well as inverter/crossover network 20. The multiplexers perform time sharing functions on inputs from both sources in a known manner. In a perferred embodiment, A multiplexer 22 and B multiplexer 24 are controlled by the programmable device. In response to the programmable device, A multiplexer outputs an A path pulse train and B multiplexer 24 outputs a B path pulse train.

The A path pulse train is inputted to A buffer 28 and the B path pulse train is inputted to B buffer 30. The buffers function to smooth and shape the respective signals in a conventional manner. The A buffer 28 outputs a pulse train to A ramp generator 32 and the B buffer 30 outputs a pulse train to B ramp generator 34.

To obtain the desired accuracy of delay measurement, the ramp generators must produce a very linear ramp. Accordingly, they comprise at least two subelements. The first subelement accounts for long term drift such as is due to change in temperature. The second subelement is a very high frequency device and generates the voltage ramps as corrected by the first subelement. Each ramp generator functions to commence a voltage ramp when a pulse edge transition is inputted to it.

Connected to A ramp generator 32 and B ramp generator 34 are retrace circuitry 36A and 36B respectively. Retrace circuitry 36A and 36B function to cause the ramp generators to cease ramping when a certain voltage is reached and to drop back down to the reference voltage to await the next pulse edge transition.

Figure 3:
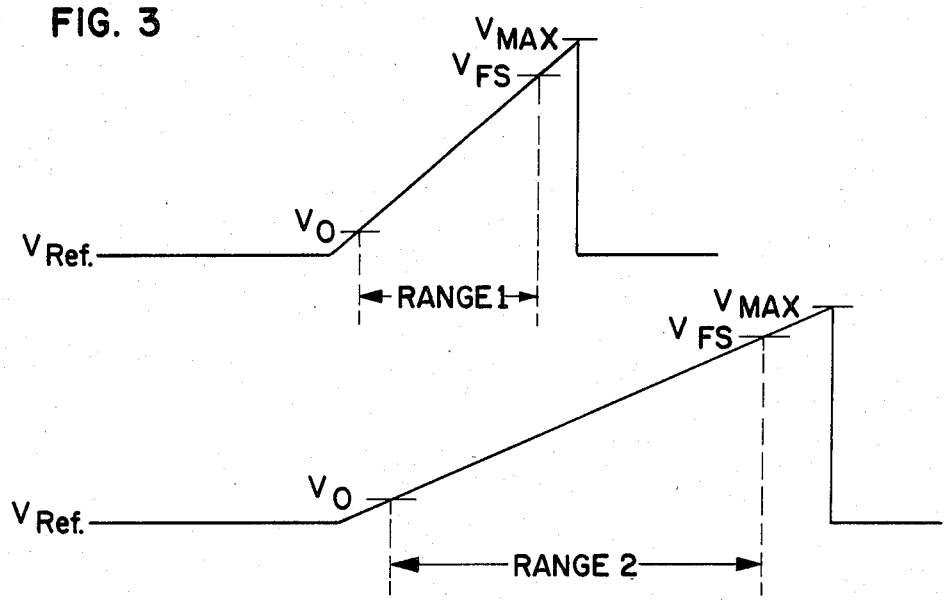
FIG. 3 is a pair of time domain waveform diagram showing retrace and range switching functions on voltage ramps of different time ranges.

The functioning of the individual ramp generators and their associated retrace circuitry is shown in FIG. 3. The ramp starts up from the reference voltage, V ref, when an edge transition from the input pulse train is sensed by the ramp generator. It will continue to ramp up until it reaches the maximum voltage, V max, at which time the retrace circuitry associated with that ramp generator commands a retrace and the voltage drops back down to V ref. There the ramp generator awaits the next pulse edge transition. The period of time that it takes the ramp to complete a cycle from commencing to ramp to retrace represents the maximum possible length of time that a delay can be and still be measured by test circuit 10. This time is represented by range 1 in the figure. In actual practice, the usable portion of the ramp is defined by a voltage representing zero time delay, Vo, and a voltage representing the full scale delay, Vfs.

In a preferred embodiment, it is possible to selectively vary the time range of the ramp generators. This is accomplished by varying the slope of the ramp. This affects the amount of time that it takes the ramp to reach the voltage at which retrace occurs by comparing the two ramps shown in FIG. 3. It can be seen that Vmax is constant but that range 2 is twice range 1. For example, range 1 could represent a range of 50 nanoseconds and range 2 then represents a range of 100 nanoseconds. Where the time delay to be measured is known to be approximately 70 nanoseconds, range 1 does not have the range required to make such a measurement. Range 2 must be selected.

Range switch circuitry is incorporated with each ramp generator. In a preferred embodiment, the ranges are 10, 20, 50, 100 and 1000 nanoseconds. In a further preferred embodiment, control of the range selection is done by a programmable device.

Referring to FIG. 1, A ramp generator 32 provides the A path pulse train to first variable delay device 38. B ramp generator 34 provides the B path pulse train to second variable delay device 40. The variable delay devices interact with edge detector 42 in a known manner to produce a feedback voltage that is representative of the time delay between a pulse edge transition of the A path pulse train with reference to a pulse edge transition of the B path pulse train. First variable delay device 38, second variable delay device 40, edge detector 42 and feedback voltage inputted to variable delay device 38 substantially comprise the known delay lock loop.

Range switch device 44 functions as a low pass filter. The known delay lock loop is an integrating circuit. To be able to utilize the feedback voltage, such voltage must be kept at a substantially constant level from pulse to pulse. As a result of the range switching capabilities previously described, there is a possibility that the feedback voltage may drop between pulses. To prevent this, it is necessary to switch in appropriate circuitry as a function of the range. Preferably such circuitry comprises capacitors of varying sizes, but, essentially, they are larger capacitors with the longer ranges and samller capacitors with the shorter ranges. In a preferred embodiment, range switch device 44 is controlled by a programmable device. Range switch device 44 outputs the feedback voltage to operational amplifier 46.

Operational amplifier 46 receives two inputs, the feedback voltage and a voltage from reference voltage device 48 which provides an appropriate offset to the feedback voltage. Operational amplifier 46 outputs an amplified version of the offset feedback voltage to the second input of variable delay device 38. This offset feedback voltage is representative of the time delay between the pulse edge transitions being measured.

The preferred output circuitry of test device 10 is shown in the upper righthand corner of FIG. 1 and consists of attenuator 50, instrumentation amplifier 52, analog to digital converter 54 and buss 56.

Attenuator 50 sets the full scale output voltage of the instrumentation amplifier. This voltage represents the maximum delay of the range selected. For example, in the 50 nanosecond range, the full scale output voltage of the instrumentation amplifier is equivalent to a delay of 50 nanoseconds. Zeroing circuitry 58 fixes the voltage representing zero delay, Vo in FIG. 2, and sends it to the second input of second variable delay device 40. In a preferred embodiment, both attenuator 50 and zeroing circuitry 58 are range switched simultaneously with previously mentioned range switch functions. In a further embodiment, such range switching is controlled by a programmable device.

Attenuator 50 takes the feedback voltage as it is inputted to first variable delay device 38, and outputs an appropriately sized voltage to instrumentation amplifier 52 for amplification. The amplified voltage is outputted to analog to digital converter 54. Reference voltage 55 provides an offset to center the output of A/D Converter 54.

In a preferred embodiment, analog to digital converter 54 is a twelve bit device and converts the three voltages to a digital signal. As an example, for a range of 20 nanoseconds, Vo is equivalent to approximately 400 bits and Vfs is equivalent to approximately 3400 bits. For this range scale then, 20 nanoseconds represents an amplified version of Vfs minus Vo or approximately 3000 bits. Provided that the range is properly selected, the feedback voltage will fall between Vo and Vfs at the measured delay. This voltage will equate to a certain number of bits. In the preferred embodiment, such digital signals are sent to buss 56 and to the programmable device.

Calibrator 26 plays an important role in ensuring overall system accuracy. The first function that it performs may be referred to as deskewing. The various components of test device 10 through which the pulse trains pass introduce a delay in the signals which skews the feedback voltage that is determined. If this delay can be determined, it can be added to or subtracted from the buss data 57 to deskew it. To accomplish this, calibrator 26 sends two simultaneous pulse trains to pin card electronics 14. One such pulse train acts as the reference and is sent through path B of test device 10. The other pulse train is sequentially sent through each pin interface and through path A of test device 10. Since the two pulse trains were simultaneous, or had zero delay, any delay that is generated is due solely to the path from the selected pin interface. Each such delay is retained in memory in the programmable device to be recalled when the specific pin is to be measured. In the example previously given where the measurement was to be made from pin five to pin seven, both the deskew value for pin five and for pin seven would be added to or subtracted from the buss data 57 that is outputted.

The second function that calibrator 26 performs is to very accurately determine the zero and full scale voltage values for each range by means of signals sent to A multiplexer 22 and B multiplexer 24 and digital signals fedback to calibrators from the programmable device. To do this, the ranges are sequentially selected. At each range, the programmable device looks at the digital outputs of test device 10 relating to such voltages, and first determines if each one is within a predetermined voltage span. If the two voltages fall within their respective voltage spans, the programmable device determines that test device 10 is functional in the selected range and proceeds to the second portion of the calibration function. In the second portion, calibrator 26 receives from the programmable device the digital signals representative of the zero voltage and full scale voltage. The programmable device determines the difference between the two, the 3000 bits in the previously used example. Using this figure and the selected range, the programmable device calculates a certain number of picoseconds of delay per bit. This ratio is stored and subsequently applied to the digital signal representative of the feedback voltage each time the range is selected to accurately determine the time delay. Calibrator 26 sequentially performs the above two functions for each range.

Numerous characteristics and advantages of the invention for which this application has been submitted have been set forth in the foregoing description. It will be understood, however, that this disclosure is, in many respects, only illustrative. Changes may be made in details, particularly in matters of shape, size, and arrangement of parts without exceeding the scope of the invention. The invention's scope is, of course, defined in the language in which the appended claims are expressed.

What is claimed is:

1. A delay lock loop including first time delay means having an input connected to a first pulse train source, which source is a first pin of an electronic device, and having an output connected to and providing a first pulse train to a first input means of a pulse edge detector means having first and second input means, the pulse edge detector means producing an analog output signal related to the time interval of between an edge transition of a pulse on the first input means and a pulse on the second input means, second time delay means having an input connected to a second pulse train source which pulse train source is a second pin of said electronic device and having an output connected to and providing a second pulse train to the second input means of the pulse edge detector means and having feedback means for providing the output signal related to the time interval to the second time delay means to provide an input thereto to control the time delay of the second pulse train, wherein the improvement comprises:
   first ramp generator means coupled between the first pulse train source and the first time delay means for generating a highly linear voltage ramp commencing at a reference voltage in response to a transition of a pulse edge of the first pulse train;
   first retrace means connected to the first ramp generator means for terminating the ramp when it has attained a certain voltage and commanding the first ramp generator means to return to the reference voltage; and
   second ramp generator means coupled between the second pulse train source and the second time delay means for generating a highly linear voltage ramp commencing at a reference voltage in response to a transition of a pulse edge of the second pulse train, second retrace means connected to the second ramp generation means for terminating the second ramp when it has attained a certain voltage and commanding the second ramp generator means to return to the reference voltage.

2. An improved delay lock loop as claimed in claim 1 having range switch means connected thereto for selectively controlling the maximum time delay capable of measurement by the delay lock loop.

3. The device of claim 2 having first range switch means connected to the first ramp generator means for selectively commanding such ramp generator to ramp at a greater or lesser slope and second range switch means connected to the second ramp generator means for selectively commanding such ramp generator to ramp at a greater or lesser slope.

4. The device of claim 3 wherein a working range on voltage ramp is defined by a zero voltage representing zero delay and a full-scale voltage representing the maximum delay measurable on the selected range, such device having range switch means connected thereto for setting the time delay between the zero and full-scale voltages as a function of the range selected.

5. An improved delay lock loop as claimed in claim 4 wherein the selectable time delay ranges are 10, 20, 50, 100 and 1000 nanoseconds.

6. An improved delay lock loop as claimed in claim 5 wherein the range switching is controlled by a digitally programmable device.

7. The device of claim 1 having pin card electronics means comprising pin interface means connected to the electronic device at the first and second pins thereof for receiving the first and second pulse trains therefrom and for outputting such pulse trains to the delay lock loop.

8. The device of claim 7 wherein the electronic device has a plurality of pins and the pin card electronics means has a plurality of pin interface means, each for connection to a pin of the electronic device.

9. The device of claim 7 or 8 wherein each pin interface means has four output means for selectively outputting one of four voltages sensed at the pin of the electronic device to which such pin interface means is connected.

10. The device of claim 1 further including first multi-path "OR" gate means connected between the first pulse train source and the first time delay means, the first pulse train source generating at least two distinct pulse trains and outputting them to the first multi-path "OR" gate means, such "OR" gate means functioning to selectively send one of the pulse trains to the first time delay means, and second multi-path "OR" gate means connected between the second pulse train source and the second time delay means, the second pulse train source generating at least two distinct pulse trains and outputting them to the second multi-path "OR" gate means, such "OR" gate means functioning to selectively send one of the pulse trains to the second time delay means.

11. The device of claim 10 wherein the first and second multi-path "OR" gate means each have 64 inputs selectively feeding a single output.

12. The device of claim 10 or 11 having inverter-crossover means coupled between the first and second "OR" gate means and the first and second time delay means and connected thereto for sensing negative going pulses and inverting all negative going pulses in the first and second pulse trains and functioning to output such inverted pulses and all positive going pulses to the respective time delay means.

13. The device of claim 4 or 5 having a useful portion of the voltage ramps defined by a zero voltage threshold relating to zero delay and a full-scale voltage threshold relating to the maximum delay measurable in the range selected, wherein a zero set means is connected to the second time delay means for selectively inputting a zero voltage threshold thereto for each time delay range, and a full-scale set means is connected to the first time delay means for selectively inputting a full-scale voltage threshold thereto for each time delay range.

14. The device of claim 4 or claim 5 having analog to digital conversion means for converting the analog output signal to a digital output signal wherein a number of bits of information are related to a period of time, which period of time is a function of the time delay range selected.

15. The device of claim 14 having calibrator means connected thereto for generating at least two coincident pulse trains exhibiting substantially zero time delay between the edge transitions of one such pulse train with respect to the edge transitions of the other such pulse train, the calibrator means selectively inputting the coincident pulse trains to the pin card electronics means and thence to each pin interface means, a first coincident pulse train outputted from a pin interface means of the pin card means comprising the first pulse train, which pulse train is delayed by the delay lock loop, a second coincident pulse train comprising a reference against which the delay induced in the first pulse train is measured, which delay comprises an error in the output signal of the delay lock loop, such error being computed for each pin card interface means and stored by the programmable device to connecting the digital output signal.

16. The device of claim 15 further including a programmable device for controlling the delay lock loop, and wherein the programmable device further causes the device to sequentially step through the time delay ranges and determines if the zero voltage threshold and full-scale threshold for each range and within predetermined limits for satisfactory operation, and further examines the digital output for each such range and determines a certain number of bits of information equal to each picosecond of delay as a function of the range selected and the number of bits observed between the zero voltage threshold and full-scale voltage threshold, which determination is utilized in accurately scaling the digital output signal.

* * * * *